US006766345B2

(12) United States Patent
Stein et al.

(10) Patent No.: US 6,766,345 B2
(45) Date of Patent: Jul. 20, 2004

(54) GALOIS FIELD MULTIPLIER SYSTEM

(75) Inventors: Yosef Stein, Sharon, MA (US); Haim Primo, Tikwa (IL); Joshua A. Kablotsky, Sharon, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/060,699

(22) Filed: Jan. 30, 2002

(65) Prior Publication Data

US 2003/0105791 A1 Jun. 5, 2003

Related U.S. Application Data

(60) Provisional application No. 60/334,662, filed on Nov. 30, 2001, and provisional application No. 60/334,510, filed on Nov. 30, 2001.

(51) Int. Cl.$^7$ ................................ G06F 7/00
(52) U.S. Cl. ........................................ 708/492
(58) Field of Search ............................. 708/491, 492

(56) References Cited

U.S. PATENT DOCUMENTS

| 3,303,477 | A | | 2/1967 | Voigt |
| 3,805,037 | A | | 4/1974 | Ellison |
| 4,722,050 | A | | 1/1988 | Lee et al. |
| 4,847,801 | A | | 7/1989 | Tong |
| 4,852,098 | A | * | 7/1989 | Brechard et al. ............ 714/782 |
| 4,918,638 | A | * | 4/1990 | Matsumoto et al. ........ 708/492 |
| 5,095,525 | A | | 3/1992 | Almgren et al. |
| 5,214,763 | A | | 5/1993 | Blaner et al. |
| 5,379,243 | A | | 1/1995 | Greenberger et al. |
| 5,386,523 | A | | 1/1995 | Crook et al. |
| 5,446,850 | A | | 8/1995 | Jeremiah et al. |
| 5,689,452 | A | | 11/1997 | Cameron |
| 5,832,290 | A | | 11/1998 | Gostin et al. |
| 5,996,057 | A | | 11/1999 | Scales, III et al. |
| 6,049,815 | A | | 4/2000 | Lambert et al. |
| 6,199,086 | B1 | | 3/2001 | Dworkin et al. |
| 6,199,087 | B1 | | 3/2001 | Blake et al. |
| 6,223,320 | B1 | | 4/2001 | Dubey et al. |
| 6,230,179 | B1 | | 5/2001 | Dworkin et al. |
| 6,246,768 | B1 | | 6/2001 | Kim |
| 6,349,318 | B1 | | 2/2002 | Vanstone et al. |
| 6,434,662 | B1 | * | 8/2002 | Greene et al. ............... 711/108 |
| 6,587,864 | B2 | | 7/2003 | Stein et al. |
| 2002/0041685 | A1 | | 4/2002 | McLoone et al. |
| 2002/0147825 | A1 | | 10/2002 | Stein et al. |
| 2003/0103626 | A1 | | 6/2003 | Stein et al. |
| 2003/0110196 | A1 | | 6/2003 | Stein et al. |
| 2003/0115234 | A1 | | 6/2003 | Stein et al. |
| 2003/0133568 | A1 | | 7/2003 | Stein et al. |
| 2003/0140211 | A1 | | 7/2003 | Stein et al. |
| 2003/0140212 | A1 | | 7/2003 | Stein et al. |
| 2003/0140213 | A1 | | 7/2003 | Stein et al. |
| 2003/0149857 | A1 | | 8/2003 | Stein et al. |

FOREIGN PATENT DOCUMENTS

EP     1 246 389 A1     10/2002

OTHER PUBLICATIONS

Viktor Fischer, *Realization of the Round 2 AES Candidates Using Altera FPGA*, (Jan. 26, 2001) <http://csrc.nist.gov/CryptoToolkit/aes/roun2/conf3/papers/24–vfischer.pdf> (Micronic—Kosice, Slovakia).

(List continued on next page.)

*Primary Examiner*—Chuong Dinh Ngo
(74) *Attorney, Agent, or Firm*—Iandiorio & Teska

(57) ABSTRACT

A Galois field multiplier system includes a multiplier circuit for multiplying two polynomials with coefficients over a Galois field to obtain their product; a Galois field linear transformer circuit responsive to the multiplier circuit for predicting the modulo remainder of the polynomial product for an irreducible polynomial; and a storage circuit for supplying to the Galois field linear transformer circuit a set of coefficients for predicting the modulo remainder for predetermined irreducible polynomial.

7 Claims, 5 Drawing Sheets

OTHER PUBLICATIONS

Máire McLoone and J.V. McCanny, *High Performance Single–Chip FPGA Rijndael Algorithm Implementations*, CHES 2001 PROC, LNCS 2162, 65–76 (ç.K. Koç et al. eds. May 16, 2001).

Elixent, *Changing the Electronic Landscape* (2001) <http://www.elixent.com> (elixent—Bristol, UK).

Elixent Application Note *JPEG Codec* (Dec. 9, 2002) <http://www.elixent.com/assets/jpeg-coder.pdf> (elixent—Bristol, UK).

U.S. patent application Ser. No. 10/440,330, Stein et al., filed May 16, 2003.

U.S. patent application Ser. No. 10/395,620, Stein et al., filed Mar. 24, 2003.

V. Baumgarte et al., *PACT XPP—A Self–Reconfigurable Data Processing Architecture* (Jun. 2001) <http://www.pact-corp.com/xneu/download/ersa01.pdf>(PACT XPP—Santa Clara, CA).

PACT Informationstechnologie GmbH, *The XPP White Paper Release 2.1* (Mar. 27, 2002) <http://www.pactcorp.com/xneu/download/xpp_white_paper.pdf>(PACT XPP—Santa Clara, CA).

\* cited by examiner

GALOIS FIELD MULTIPLIER SYSTEM

RELATED APPLICATIONS

This application claims priority from U.S. Provisional Application Serial No. 60/334,662, filed on Nov. 30, 2001 to Stein et al., entitled GF2-ALU. This application also claims priority from U.S. Provisional Application Serial No. 60/334,510, entitled PARALLEL GALOIS FIELD MULTIPLIER filed Nov. 30, 2001 to Stein et al.

FIELD OF THE INVENTION

This invention relates to a Galois field multiplier system.

BACKGROUND OF THE INVENTION

Multiplication of polynomials with coefficients in Galois fields (GF) is widely used in communication systems for Reed Solomon (RS) coding and in advanced encryption standards (AES). Galois field multiplication is difficult and time consuming for traditional digital signal processors (DSP) to perform. DSP's are optimized for finite impulse response (FIR) filtering and other multiply accumulate (MAC) intensive operations, but do not efficiently process Galois field types of operations. One approach uses straight forward polynomial multiplication and division over the Galois field using linear feedback shift registers (LFSR's) which process one bit at a time. This is a very slow process. For example, in broadband communication for AES types of applications, where the bit rate is up to 40 megabits per second, there will be up to 5 million GF multiplications per second (MPS) and each multiplication may require many e.g. 60–100 operations. Another approach uses look-up tables to perform the Galois field multiplication. Typically, this approach requires 10–20 or more cycles which for 5 mps results in a somewhat lower but still very large number of operations e.g. 20×5=100 mps or more. Reed-Solomon codes have been widely accepted as the preferred error control coding scheme for broadband networks. A programmable implementation of a Reed-Solomon encoder and decoder is an attractive solution as it offers the system designer the unique flexibility to trade-off the data bandwidth and the error correcting capability that is desired based on the condition of the channel. The first step in Reed-Solomon decoding is the computing of the syndromes. The syndromes can be formally defined as Si=R mod G where i=(0,1 . . . 15). The received code word may be expressed in polynomial form as $R_i = r_o X^{N-1} + r_1 X^{N-2} + \ldots r_{N-1}$ where the length of the received word is N. It can be seen that computing the syndrome amounts to polynomial evaluation over Galois field at the roots as defined by the $j^{ith}$ power of the $i^{ith}$ root of the generator polynomial. For each received word in the Reed-Solomon Algorithm there are sixteen syndromes to be calculated which raise the operations by a factor of sixteen to 1.6 GIGA-operations per second-not practical on current microprocessors. Using the straight forward multiplication instead of the look-up tables raises the operation rate to 6.4 GIGA-operations per second. The need for Galois field multiplications is increasing dramatically with the expansion of the communications field and the imposition of encryption requirements on the communication data. This further complicates the matter because each domain-error checking, encryption-needs Galois field multiplication over a different Galois field which requires different sets of look-up tables.

BRIEF SUMMARY OF THE INVENTION

It is therefore an object of this invention to provide a new and improved Galois field multiplier system.

It is a her object of this invention to provide such a new and improved Galois field multiplier system which is much faster than current look-up tables and linear feedback shift registers (LFSR) implementations.

It is a further object of this invention to provide such a new and improved Galois field multiplier system which reduces the amount of storage required.

It is a further object of this invention to provide such a new and improved Galois field multiplier system which dramatically reduces the number of required operations per second.

It is a further object of this invention to provide such a new and improved Galois field multiplier system which can reduce the required operation to a fraction of a cycle.

The invention results from the realization that a Galois field multiplication can be effected by doing more then one Galois field multiplication in a cycle in two steps: first, the multiplication of the two polynomials with coefficients over a Galois field to obtain their product, and second, the division of their product by a predetermined irreducible polynomial to obtain the modulo remainder and the further realization that such a Galois field multiplication can be achieved with a system that has a Galois field linear transformer circuit which responds to the multiplication product to predict the modulo remainder and a storage circuit which supplies to the Galois field linear transformer circuit a set of coefficients for predicting the modulo remainder for a predetermined irreducible polynomial.

This invention features a Galois field multiplier system including a multiplier circuit for multiplying two polynomials with coefficients over a Galois field to obtain their product and a Galois field linear transformer circuit responsive to the multiplier circuit for predicting the modulo remainder of the polynomial product for an irreducible polynomial. A storage circuit supplies to the Galois field linear transformer circuit a set of coefficients for predicting the modulo remainder for a predetermined irreducible polynomial.

In a preferred embodiment, the Galois field linear transformer circuit may divide the polynomial product by the irreducible polynomial to obtain the modulo remainder. The multiplier circuit may include an AND-logic circuit for each term of the polynomial product to effect the Galois multiplication. The mulitplier circuit may include an exclusive Or-logic circuit for each pair of terms in the polynomial product to effect the Galois summation. The Galois field linear transformer circuit may include a Galois field linear transformer including a matrix responsive to a number of input bits in one or more bit streams and having a plurality of outputs for providing the Galois field linear transformation of those bits. The matrix may include a plurality of cells, each cell including an exclusive OR-logic circuit and an AND-logic circuit having an output connected to the exclusive OR-logic circuit and an input connected to one of the input bits. The Galois field linear transformer circuit may include a plurality of Galois field transformer units and the storage circuit may supply the coefficients in parallel to the Galois field transformer units. The Galois field linear transformer circuit may include a plurality of storage units, one associated with each of the Galois field linear transformer units. Wherein the storage circuit provides an input to the AND-logic circuit for setting the matrix to obtain a multicycle Galois field linear transformation of the inputs in a single cycle.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
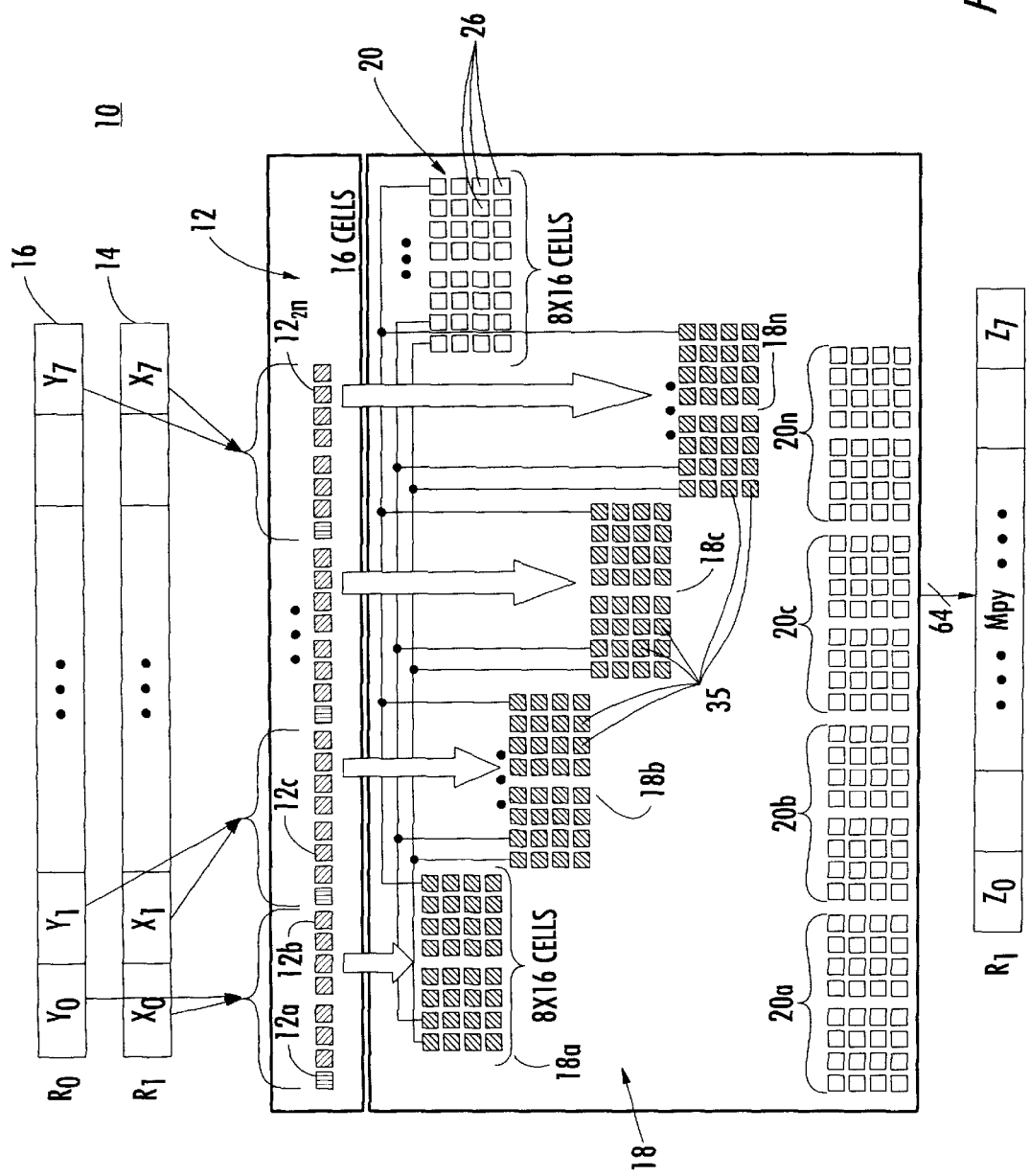
FIG. 1 is a schematic block diagram of a Galois field multiplier system according to this invention.

A Galois field GF(n) is a set of elements on which two binary operations can be performed. Addition and multiplication must satisfy the commutative, associative and distributive laws. A field with a finite number of elements is a finite field. An example of a binary field is the set $\{0,1\}$ under modulo 2 addition and modulo 2 multiplication and is denoted GF(2). The modulo 2 addition and multiplication operations are defined by the tables shown in the following figure. The first row and the first column indicate the inputs to the Galois field adder and multiplier. For e.g. 1+1=0 and 1*1=1.

| Modulo 2 Addition (XOR) | | |
|---|---|---|
| + | 0 | 1 |
| 0 | 0 | 1 |
| 1 | 1 | 0 |
| Modulo 2 Multiplication (AND) | | |
| * | 0 | 1 |
| 0 | 0 | 0 |
| 1 | 0 | 1 |

In general, if p is any prime number then it can be shown that GF(p) is a finite field with p elements and that GF($p^m$) is an extension field with $p^m$ elements. In addition, the various elements of the field can be generated as various powers of one field element, $\alpha$, by raising it to different powers. For example GF(256) has 256 elements which can all be generated by raising the primitive element, $\alpha$, to the 256 different powers.

In addition, polynomials whose coefficients are binary belong to GF(2). A polynomial over GF(2) of degree m is said to be irreducible if it is not divisible by any polynomial over GF(2) of degree less than m but greater than zero. The polynomial $F(X)=X^2+X+1$ is an irreducible polynomial as it is not divisible by either X or X+1. An irreducible polynomial of degree m which divides $X^{2^{m-1}}+1$, is known as a primitive polynomial. For a given m, there may be more than one primitive polynomial. An example of a primitive polynomial for m=8, which is often used in most communication standards is $F(X)=x^8+x^4+x^3+x^2+x+1$.

Galois field addition is easy to implement in software, as it is the same as modulo addition. For example, if 29 and 16 are two elements in GF($2^8$) then their addition is done simply as an XOR operation as follows: 29(11101)⊕16(10000)=13(01101).

Galois field multiplication on the other hand is a bit more complicated as shown by the following example, which computes all the elements of GF($2^4$), by repeated multiplication of the primitive element $\alpha$. To generate the field elements for GF($2^4$) a primitive polynomial G(x) of degree m=4 is chosen as follows $G(x)=X^4+X+1$. In order to make the multiplication be modulo so that the results of the multiplication are still elements of the field, any element that has the fifth bit set is brought into a 4-bit result using the following identity $F(\alpha)=\alpha^4+\alpha+1=0$. This identity is used repeatedly to form the different elements of the field, by setting $\alpha^4=1+\alpha$. Thus the elements of the field can be enumerated as follows:

$\{0, 1, \alpha, \alpha^2, \alpha^3, 1+\alpha, \alpha+\alpha^2, \alpha^2+\alpha^3, 1+\alpha+\alpha^3, \ldots 1+\alpha^3\}$ since $\alpha$ is the primitive element for GF($2^4$) it can be set to 2 to generate the field elements of GF($2^4$) as $\{0,1,2,3,4,8, 3,6,7,12,11 \ldots 9\}$.

It can be seen that Galois field polynomial multiplication can be implemented in two basic steps. The first is a calculation of the polynomial product c(x)=a(x)*b(x) which is algebraically expanded, and like powers are collected (addition corresponds to an XOR operation between the corresponding terms) to give c(x).

For example $c(x)=(a_3x^3+a_2x^2+a_1x^1+a_0)*(b_3x^3+b_2x^2+b_1x^1+b_0)$ $C(x)=c_6x^6+c_5x^5+c_4x^4+c_3x^3+c_2x^2+c_1x^1+c_0$ where:

Chart I $c_0=a_0*b_0$
$c_1=a_1*b_0 \oplus a_0*b_1$
$c_2=a_2*b_0 \oplus a_1*b_1 \oplus a_0*b_2$
$c_3=a_3*b_0 \oplus a_2*b_1 \oplus a_1*b_2 \oplus a_0*b_3$
$c_4=a_3*b_1 \oplus a_2*b_2 \oplus a_1*b_3$
$c_5=a_3*b_2 \oplus a_2*b_3$
$c_6=a_3*b_3$ The second is the calculation of d(x)=c(x) modulo p(x).

To illustrate, multiplications are performed with the multiplication of polynomials modulo an irreducible polynomial. For example: (if $m(x)=x^8+x^4+x^3+x+1$)
$\{57\}*\{83\}=\{c1\}$ because, First Step $(x^6 + x^4 + x^2 x + 1) + (x^7 + x + 1) = x^{13} \oplus x^{11} \oplus x^9 \oplus x^8 \oplus x^7$ $x^7 \oplus x^5 \oplus x^3 \oplus x^2 \oplus x$ $x^6 \oplus x^4 \oplus x^2 \oplus x \oplus x$ $= x^{13} \oplus x^{11} \oplus x^9 \oplus x^8 \oplus x^6 \oplus$ $x^5 \oplus x^4 \oplus x^3 \oplus 1$ Second Step $x^{13} + x^{11} + x^9 + x^8 + x^6 + x^5 x^4 + x^3 +$ $1 \; modulo(x^8 + x^4 + x^3 + x + 1) = x^7 + x^6 + 1$ An improved Galois field multiplier system 10, FIG. 1 foreclosing on this approach includes a multiplier circuit 12 for multiplying two polynomials $x_0$–$x_7$ in R1 register 14 with the polynomials $y_0$–$y_7$ in R0 register 16 with coefficients over a Galois field to obtain their product. Multiplier circuit 12 actually includes a plurality of multiplier cells 12a, 12b, 12c . . . 12n.

Each term includes an AND function as represented by an * and each pair of terms are combined with a logical exclusive OR as indicated by a ⊕. This product as represented in Chart I is submitted to a Galois field linear transformer circuit 18 which may include a number of Galois field linear transformer units 18a, 18b, 18c, . . . 18n each composed of 15×8 cells 35, which respond to the product produced by the multiplier circuit 12 to predict the modulo remainder of the polynomial product for a predetermined irreducible polynomial. The $x_0$, $y_0$ multiplication is performed in unit 18a, the $x_1$, $y_1$ in unit 18b, the $x_2$, $y_2$ in unit 18c, and the $x_n$, $y_n$ in unit 18n. The operation of this unique Galois field linear transformer circuit and each of its transformer units is explained in U.S. Patent Application to Stein et al. entitled GALOIS FIELD LINEAR TRANSFORMER which is incorporated herein in its entirety by this reference. Each of the Galois field linear transformer units predicts the modulo remainder by dividing the polynomial product by an irreducible polynomial. That irreducible polynomial maybe, for example, anyone of those shown in Chart II.

Chart II

:$GF(2^1)$

0x3 $(x+1)$

:$GF(2^2)$

0x7 $(x^2+x+1)$

:$GF(2^3)$

0xB $(x^3+x+1)$

0xD $(x^3+x^2+1)$

:$GF(2^4)$

0x13 $(x^4+x+1)$

0x19 $(x^4+x^3+1)$

:$GF(2^5)$

0x25 $(x^5+x^2+1)$

0x29 $(x^5+x^3+1)$

0x2F $(x^5+x^3+x^2+x+1)$

0x37 $(x^5+x^4+x^2+x+1)$

0x3B $(x^5+x^4+x^3+x+1)$

0x3D $(x^5+x^4+x^3+x^2+1)$

:$GF(2^6)$

0x43 $(x^6+x+1)$

0x5B $(x^6+x^4+x^3+x+1)$

0x61 $(x^6+x^5+1)$

0x67 $(x^6+x^5+x^2+x+1)$

0x6D $(x^6+x^5+x^3+x^2+1)$

0x73 $(x^6+x^5+x^4+x+1)$

:$GF(2^7)$

0x83 $(x^7+x+1)$

0x89 $(x^7+x^3+1)$

0x8F $(x^7+x^3+x^2+x+1)$

0x91 $(x^7+x^4+1)$

0x9D $(x^7+x^4+x^3+x^2+1)$

0xA7 $(x^7+x^5+x^2+x+1)$

0xAB $(x^7+x^5+x^3+x+1)$

0xB9 $(x^7+x^5+x^4+x^3+1)$

0xBF $(x^7+x^5+x^4+x^3+x^2+x+1)$

0xC1 $(x^7+x^6+1)$

0xCB $(x^7+x^6+x^3+x+1)$

0xD3 $(x^7+x^6+x^4+x+1)$

0xE5 $(x^7+x^6+x^5+x^2+1)$

0xF1 $(x^7+x^6+x^5+x^4+1)$

0xF7 $(x^7+x^6+x^5+x^4+x^2+x+1)$

0xFD $(x^7+x^6+x^5+x^4+x^3+x^2+1)$

:$GF(2^8)$

0x11D $(x^8+x^4+x^3+x^2+1)$

0x12B $(x^8+x^5+x^3+x+1)$

0x12D $(x^8+x^5+x^3+x^2+1)$

0x14D $(x^8+x^6+x^3+x^2+1)$

0x15F $(x^8+x^6+x^4+x^3+x^2+x+1)$

0x163 $(x^8+x^6+x^5+x+1)$

0x165 $(x^8+x^6+x^5+x^2+1)$

0x169 $(x^8+x^6+x^5+x^3+1)$

0x171 $(x^8+x^6+x^5+x^4+1)$

0x187 $(x^8+x^7+x^2+x+1)$

0x18D $(x^8+x^7+x^3+x^2+1)$

0x1A9 $(x^8+x^7+x^5+x^3+1)$

0x1C3 $(x^8+x^7+x^6+x+1)$

0x1CF $(x^8+x^7+x^5+x^3+x^2+1)$

0x1E7 $(x^8+x^7+x^6+x^5+x^2+x+1)$

0x1F5 $(x^8+x^7+x^5+x^4+x^2+1)$

The Galois field multiplier presented where $GF(2^8)$ is capable of performing with all powers $2^8$ and under as shown in Chart II. For lower polynomials the coefficients at higher than the chosen power will be zeros, e.g., if $GF(2^5)$ is implemented coefficients between $GF(2^5)$ and $GF(2^8)$ will be zero. Then the prediction won't be made above that level.

Figure 1A:
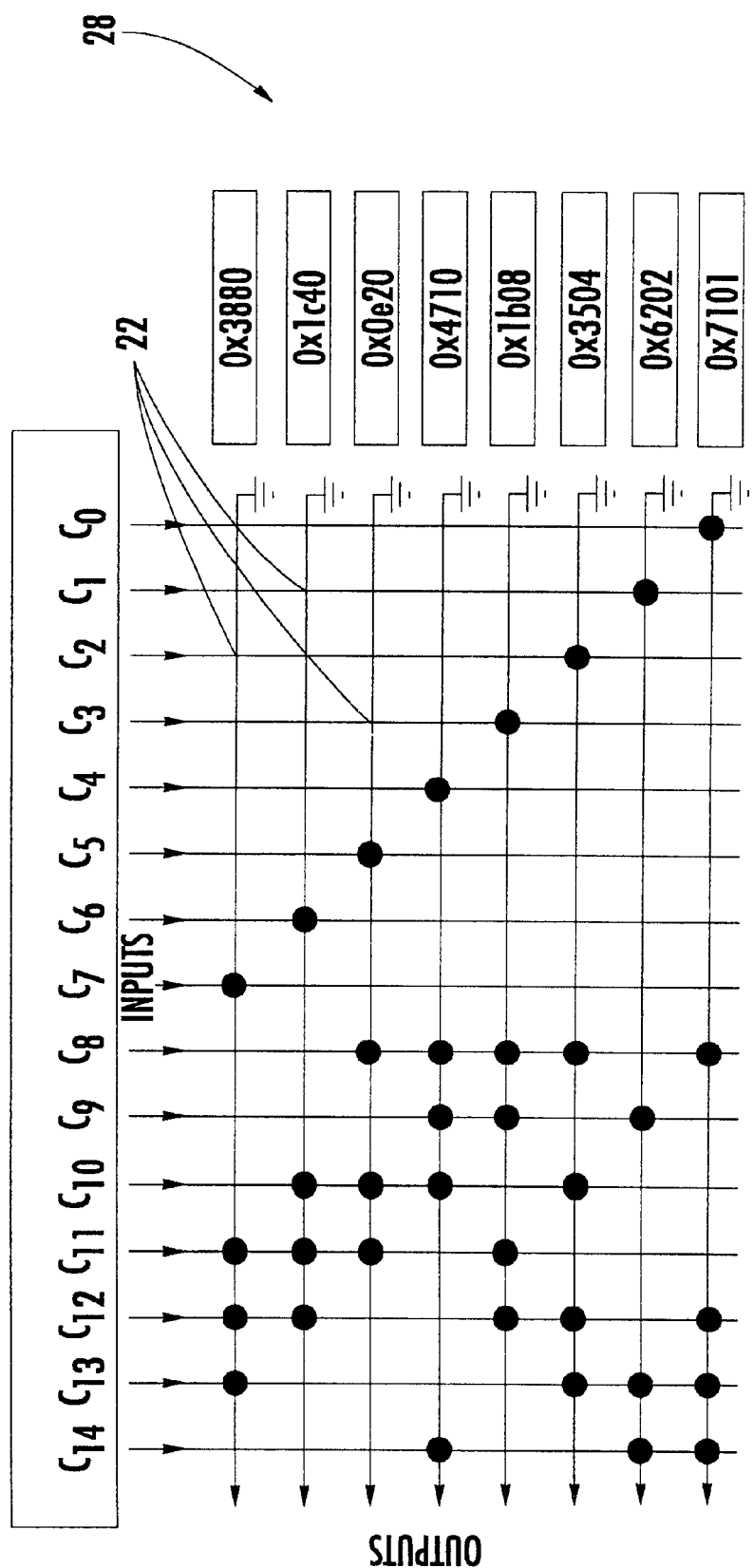
FIG. 1A is a schematic diagram of Galois field linear transformer unit of FIG. 1 showing the programming of its cells and those of the associated storage cells to achieve the predicted result.

For this particular example, the irreducible or primitive polynomial 0x11D in group GF MUL 8 has been chosen. A storage circuit 20 supplies to the Galois field linear transformer circuit a set of coefficients for predicting the modulo remainder for that particular primitive or irreducible polynomial. For a Galois field $GF(2^8)$ with primitive polynomial 0x1DD the storage circuit 20 produces the matrix setup values as shown in FIG. 1A where each crossing of lines, e.g., 22 represents a cell 35 of linear transformer units 18a, 18b, . . . 18n. Each enlarged dot 24 indicates a cell which has been enabled by the presence of a 1 in the associated storage cell 26 in storage circuit 20. The programming of the storage cells 26 of circuit 20 to provide the proper pattern of 1's to produce the prediction in one cycle of the modulo operation of the irreducible polynomial is shown in column 28. The matrix shown in FIG. 1A is an array of fifteen inputs and eight outputs. Eight outputs represent one byte and the fifteen inputs $c_0$–$c_{14}$ are one less than the modulo to keep the results within the eight bit field.

An example of the GF multiplication according to this invention occurs as follows:

| Before GF( ) multiplication; Polynomial 0x11d | After GF9( ) multiplication; Polynomial 0x11d |
|---|---|
| 45 23 00 01h | 45 23 00 01h |
| GF( ) | GF( ) |
| 57 34 00 01h | 57 34 00 01h |
| xx xx xx xxh | 72 92 00 01h |

Figure 3:
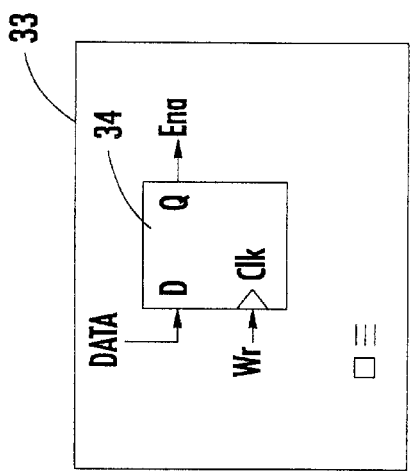
FIG. 3 is a schematic diagram of a storage device for the storage circuit of FIG. 1.
Figure 4A:
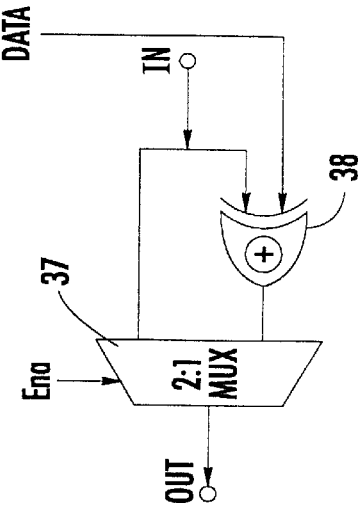
FIG. 4A is a schematic diagram of an alternative construction of a Galois field linear transformer unit cell which performs logical AND functions without a specific AND gate.
Figure 2:
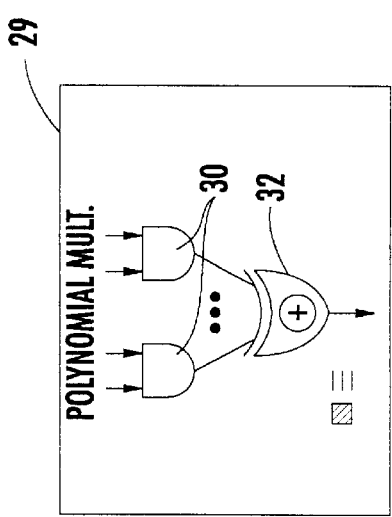
FIG. 2 is a schematic diagram of a polynomial multiplier cell that multiplies polynomials with coefficients in GF($2^n$) for the multiplier circuit of FIG. 1.
Figure 4:
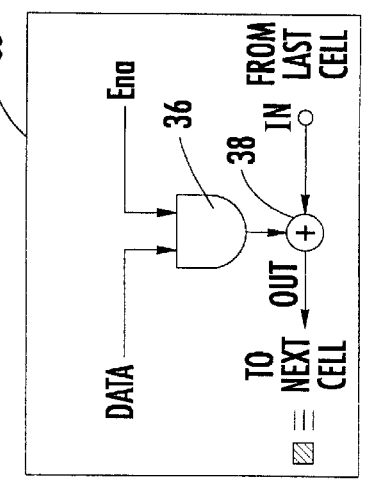
FIG. 4 is a schematic diagram of a cell of the Galois field linear transformer circuit of FIG. 1.

Each cell 29, FIG. 2, of the polynomial multiplier circuit 12 includes a number of AND gates 30, one for each term of the polynomial product and an exclusive OR gate 32 one for each pair of terms in the polynomial product. AND gate 30 executes the multiplication while exclusive OR gate 32 effect the summation. Each cell 35 receives an input I from the previous cell and provides an output to the next cell. The first cell input is grounded. Each cell, 33, FIG. 3, of storage circuit 20 includes a flip-flop 34 having a data, D, input, a Wr, Clock, input, and a Q output, enable. Each cell of the Galois field linear transformer circuit and each of the one or more units of the Galois field linear transformer circuit includes a cell 35, FIG. 4, having an AND gate 36 and an exclusive OR gate 38. As also explained in U.S. Patent Application entitled GALOIS FIELD LINEAR TRANSFORMER to Stein et al., filed Jan. 18, 2002, incorporated herein in its entirety by this reference, in each of the cells 29, 33, and 35 the specific implementations shown are not a limitation of the invention. For example the storage device 33 need not be implemented by a flip-flop, any other storage device could be used. In FIGS. 2 and 4 cells 29 and 35 respectively need AND functions and exclusive OR functions, but these may be performed in a number of different ways not requiring a specific XOR gate or AND gate as long as these are logic circuits that function in a Boolean sense like an XOR gate and AND gate. For example, the AND function can be achieved without a specific AND gate using a 2:1 input multiplexor 37, FIG. 4A which performs the AND function.

Figure 5:
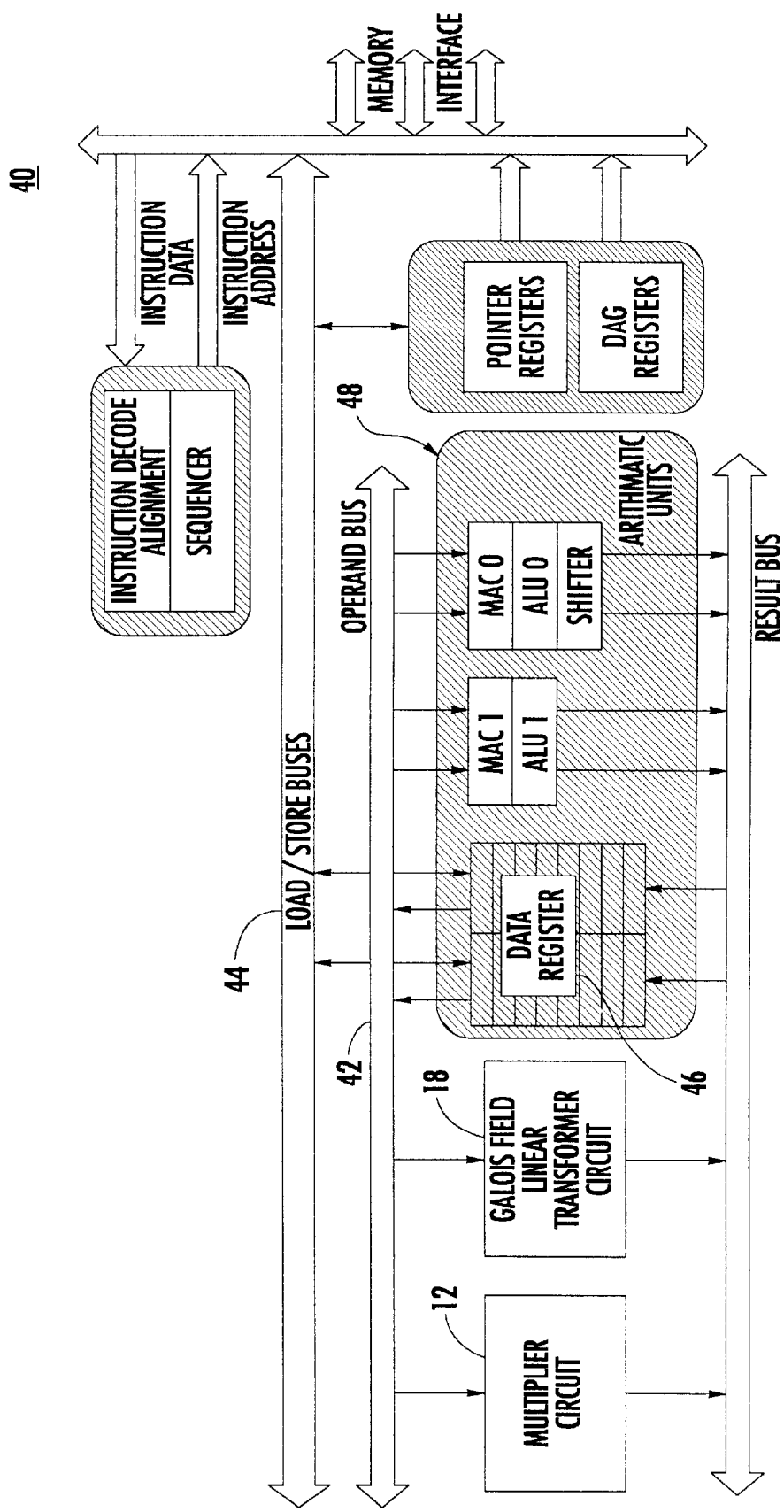
FIG. 5 is a schematic diagram of a Galois field multiplier system according to this invention associated with a digital signal processor (DSP)
Figure 6:
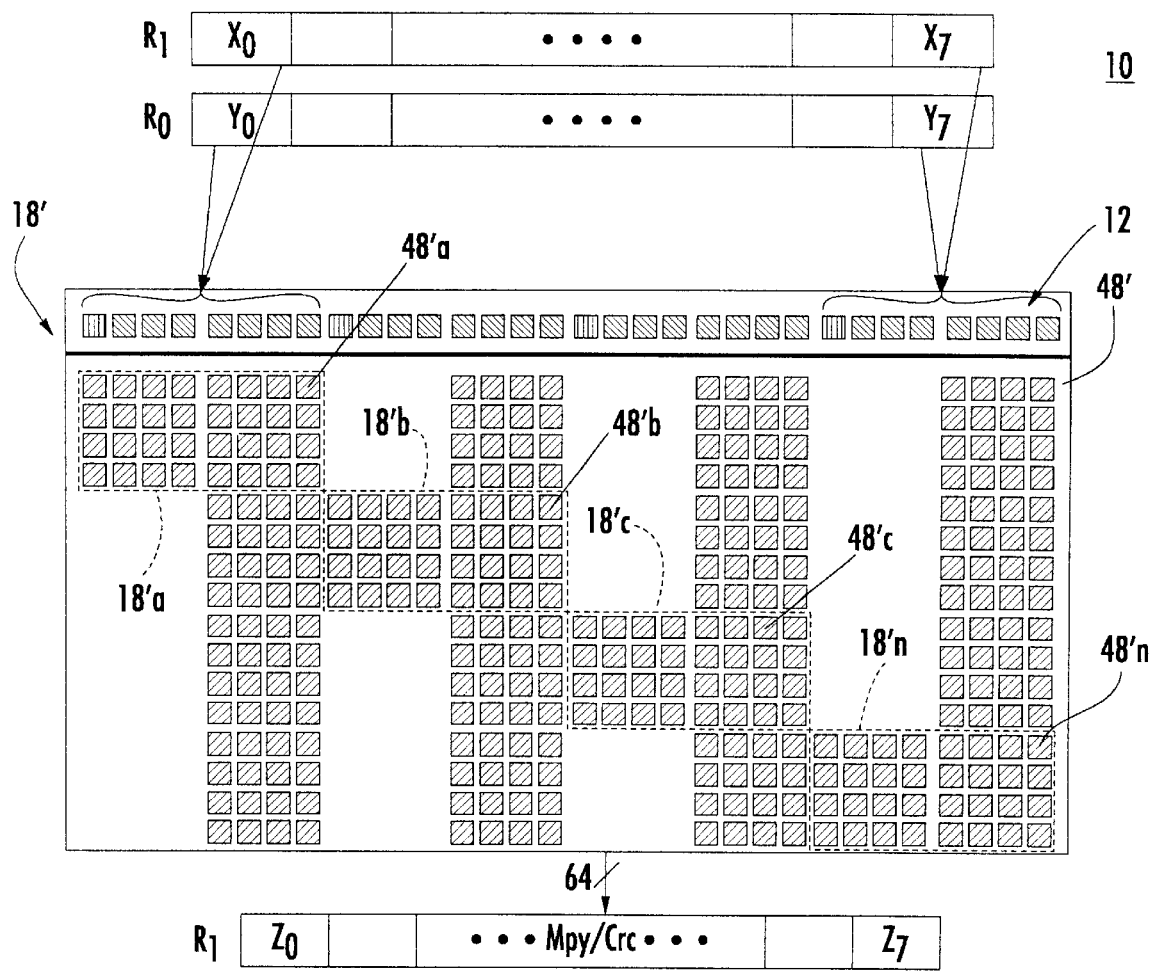
FIG. 6 is a schematic block diagram of a Galois field multiplier system according to this invention integrally formed with GF arithmetic logic unit.

The Galois field linear transformer circuit 18 may be implemented as a function unit within a programmable logic device, such as a digital signal processor, DSP 40, FIG. 5, or a general purpose microprocessor realized as an integrated circuit. This function unit is operated by a processor instruction that provides the unit with the appropriate operands on buses 42 and 44. The data stream to and from the unit is effected using the on-chip data registers 46 in a form in which the Galois field linear transformer circuit 18 functions as a part of the arithmetic logic unit 48 itself. This combination of the Galois field linear transformer circuit 18 and the multiplier circuit 12 with the arithmetic logic unit 48 allows a more versatile function where the Galois field multiplication system may be performed among other traditional operations enabling a wide range of different algorithm implementations even beyond error checking and encryption. The use of a single storage circuit 20 to set the values in each of Galois field linear transformer units 18*a*, 18*b*, . . . 18*n*, is advantageous for two reasons. It saves hardware and it allows all of the values to be set in a single cycle at one time in one operation. This is particularly useful where there is a constraint on the input signal. For example, when the input is limited to 32 bytes/cycle in which case it would take a number of cycles to load each of the units 18*a*–18*n* in sequence, but nevertheless it is contemplated by this invention that a separate storage device 20*a*, 20*b*, 20*c*, . . . 20*n* can be associated with each Galois field linear transformer unit 18*a*, 18*b*, 18*c*, . . . 18*n* if desired. Beyond being merely associated with an arithmetic logic unit, Galois field linear transformer circuit 18, FIG. 6 may actually use a portion of the arithmetic logic unit. That is, a portion 18'*a*, 18'*b*, 18'*c*, . . . 18'*n* may be formed by a portion 48'*a*, 48'*b*, 48'*c*, . . . 48'*n* of the arithmetic logic circuit 48'.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A Galois field multiplier system comprising:
   a multiplier circuit for multiplying two polynomials with coefficients over a Galois field to obtain their product;
   a Galois field linear transformer circuit having a plurality of cells and responsive to said multiplier circuit for predicting the modulo remainder of the polynomial product for an irreducible polynomial; and
   a storage circuit configured to independently program each of said cells for supplying to said Galois field linear transformer circuit a set of coefficients for predicting the modulo remainder for a predetermined irreducible polynomial.

2. The Galois field multiplier system of claim 1 in which said Galois field linear transformer circuit divides said polynomial product by said irreducible polynomial to obtain said modulo remainder.

3. The Galois field multiplier system of claim 1 in which said multiplier circuit includes and AND logic circuit for each term of said polynomial product to effect a Galois multiplier.

4. The Galois field multiplier system of claim 1 in which said multiplier circuit includes an exclusive OR logic circuit for each pair of terms in said polynomial product to effect a Galois summation.

5. The Galois field multiplier system of claim 1 in which said Galois field linear transformer circuit includes a matrix responsive to a number of input bits in one or more bit streams and having a plurality of outputs for providing the Galois field linear transformation of those bits; said matrix including a plurality of cells, each cell including an exclusive OR logic circuit, an AND logic circuit having an output connected to the exclusive OR logic circuit and an input connected to one of said input bits, said storage circuit providing said set of coefficients for setting the matrix to obtain a multicycle Galois field linear transformation of the inputs in a single cycle.

6. The Galois field multiplier system of claim 1 in which said Galois field linear transformer includes a plurality of Galois field transformer units and said storage circuit supplies said coefficients in parallel to said Galois field transformer units.

7. The Galois field multiplier system of claim 1 in which said Galois field linear transformer includes a plurality of Galois field transformer units and said storage circuit includes a plurality of storage units one associated with each of said Galois field linear transformer units.

* * * * *